(12) United States Patent
Tsukiyama et al.

(10) Patent No.: US 10,734,360 B2
(45) Date of Patent: Aug. 4, 2020

(54) SEMICONDUCTOR DEVICE (71) Applicant: TOSHIBA MEMORY CORPORATION, Minato-ku (JP)

(72) Inventors: Satoshi Tsukiyama, Yokohama (JP); Masaru Koyanagi, Ota (JP); Mikihiko Ito, Ota (JP); Kazushige Kawasaki, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/121,171

(22) Filed: Sep. 4, 2018

(65) Prior Publication Data
US 2019/0295988 A1 Sep. 26, 2019

(30) Foreign Application Priority Data
Mar. 22, 2018 (JP) .................................. 2018-055227

(51) Int. Cl.
*H01L 25/065* (2006.01)
*H01L 23/00* (2006.01)

(52) U.S. Cl.
CPC .......... *H01L 25/0657* (2013.01); *H01L 24/04* (2013.01); *H01L 24/16* (2013.01); *H01L 2224/02331* (2013.01); *H01L 2224/02371* (2013.01); *H01L 2224/02372* (2013.01); *H01L 2224/02381* (2013.01); *H01L 2224/0401* (2013.01); *H01L 2224/16146* (2013.01); *H01L 2224/16225* (2013.01); *H01L 2225/06541* (2013.01)

(58) Field of Classification Search
None
See application file for complete search history.

(56) References Cited

U.S. PATENT DOCUMENTS

| 8,653,645 | B2 | 2/2014 | Yamaoka et al. |
| 9,076,881 | B2 * | 7/2015 | Inn; Yun-Hyeok ........................ H01L 23/49811 |
| 2013/0277852 | A1 | 10/2013 | Chen |

(Continued)

FOREIGN PATENT DOCUMENTS

| TW | 201535645 A | 9/2015 |
| WO | WO2011/030467 A1 | 2/2013 |

*Primary Examiner* — Long Pham
(74) *Attorney, Agent, or Firm* — Oblon, McClelland, Maier & Neustadt, L.L.P.

(57) ABSTRACT

A semiconductor device includes a base member and semiconductor chips stacked on the base member. The semiconductor chips include a first semiconductor chip and a second semiconductor chip adjacent to the first semiconductor chip. The first semiconductor chip includes a semiconductor substrate, a functional layer and through electrodes. The through electrodes extend from the back surface to the front surface of the semiconductor substrate, and are electrically connected to the functional layer on the front surface. The second semiconductor chip is electrically connected to the first semiconductor chip through connection members connected to the through electrodes. The functional layer includes first and second contact pads. The second contact pad is positioned at a level between the semiconductor substrate and the first contact pad. The through electrodes include a first through electrode connected to the first contact pad and a second through electrode connected to the second contact pad.

20 Claims, 5 Drawing Sheets

(56) References Cited

U.S. PATENT DOCUMENTS

2015/0261245 A1 9/2015 Inoue et al.
2015/0371927 A1 12/2015 Batra et al.

\* cited by examiner

SEMICONDUCTOR DEVICE

CROSS-REFERENCE TO RELATED APPLICATIONS

This application is based upon and claims the benefit of priority from Japanese Patent Application No. 2018-055227, filed on Mar. 22, 2018; the entire contents of which are incorporated herein by reference.

FIELD

Embodiments relate to a semiconductor device.

BACKGROUND

A semiconductor device is known, which includes a plurality of semiconductor chips stacked on a base substrate. In such a semiconductor device, the semiconductor chips are electrically connected to interconnections on the base substrate using metal wires, respectively. The semiconductor chips are electrically connected to an external circuit through the metal wires and the interconnections on the base substrate. Thus, parasitic capacitance and inductance of the metal wires may affect the high-speed signal transmission between the external circuit and the semiconductor chips.

DETAILED DESCRIPTION

According to one embodiment, a semiconductor device includes a base member and a plurality of semiconductor chips stacked on the base member. The plurality of semiconductor chips are electrically connected to each other, and include a first semiconductor chip and a second semiconductor chip adjacent to the first semiconductor chip. The first semiconductor chip includes a semiconductor substrate, a functional layer and a plurality of through electrodes. The semiconductor substrate has an element surface and a back surface opposite to the element surface. The functional layer is provided on the element surface. The plurality of through electrodes extend from the back surface to the element surface in the semiconductor substrate. The plurality of through electrodes are electrically connected to the functional layer. The second semiconductor chip is electrically connected to the first semiconductor chip through connection members connected to the plurality of through electrodes, respectively. The functional layer includes a first contact pad and a second contact pad. The second contact pad is positioned at a level between the semiconductor substrate and the first contact pad in a stacking direction of the plurality of semiconductor chips. The plurality of through electrodes include a first through electrode connected to the first contact pad and a second through electrode connected to the second contact pad.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
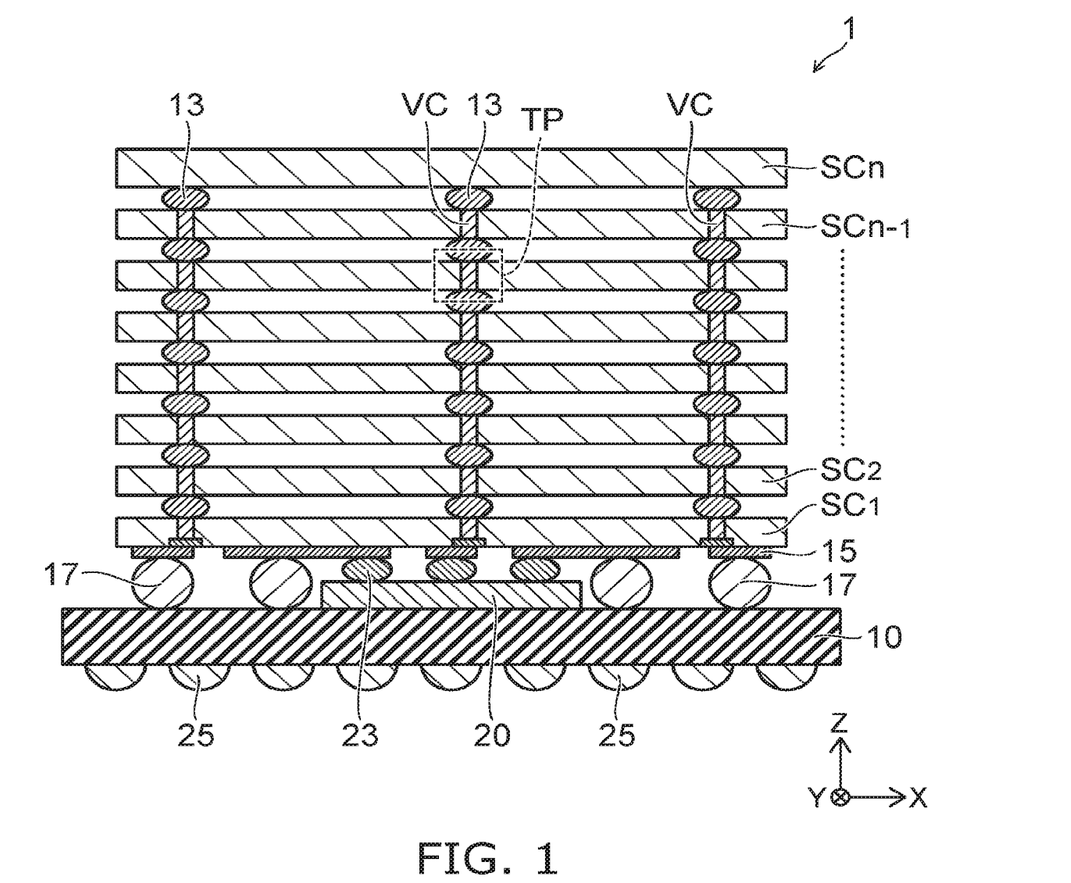
FIG. 1 is a schematic sectional view showing a semiconductor device according to an embodiment.

FIG. 1 is a schematic cross-sectional view showing a semiconductor device 1 according to an embodiment. The semiconductor device 1 includes a base member 10 and a plurality of semiconductor chips SC1-SCn. The semiconductor chips SC1-SCn are stacked on the base member 10. The semiconductor chips SC1-SCn are electrically connected to each other through connection members (hereinafter referred to as micro-bumps 13).

The semiconductor chips SC1-SCn−1 include a plurality of through electrodes VC (e.g. through silicon via, TSV) and are electrically connected to each other through the micro-bumps 13 connected to the respective through electrodes VC. An interconnection 15 is provided on the bottom surface of the semiconductor chip SC1 positioned at the lowermost level of the semiconductor chips SC1-SCn. The interconnection 15 is electrically connected to the semiconductor chip SC1. The semiconductor chip SC1 is connected to the base member 10 through a connection bump 17 connected to the interconnection 15.

The semiconductor chips SC1-SCn are sequentially flip-chip bonded via the micro-bumps 13. The micro-bump 13 has a size of e.g. 5 to 50 micrometre (μm) in diameter. The micro-bumps 13 are arranged with a pitch of 10 to 100 μm on the back surface of a semiconductor substrate SS. The through electrodes VC are arranged with a pitch of e.g. 10 to 100 μm along the back surface of the semiconductor substrate SS.

As shown in FIG. 1, the semiconductor device 1 further includes a logic chip 20 placed between the base member 10 and the semiconductor chip SC1. The logic chip 20 is connected to the interconnection 15 through e.g. a flip-chip bump (hereinafter referred to as a FC bump 23). The logic chip 20 performs e.g. data and commands transmission with the semiconductor chips SC1-SCn through the interconnection 15.

The base member 10 has a bottom surface opposite to the top surface on which the semiconductor chips SC1-SCn are placed. A plurality of connection bumps 25 are placed on the bottom surface of the base member 10. The connection bumps are electrically connected to the semiconductor chips SC1-SCn and the logic chip 20 through interconnections and connection plugs (not shown) provided in the base member 10. The connection bumps 25 connect the semiconductor device 1 to e.g. a mounting substrate, not shown, and electrically connect the semiconductor chips SC1-SCn and the logic chip 20 to an external circuit.

Thus, in the semiconductor device 1, the semiconductor chips SC1-SCn are connected to each other through the through electrodes VC and the micro-bumps 13. It is possible to perform the high-speed signal transmission with the logic chip 20.

Figure 2:
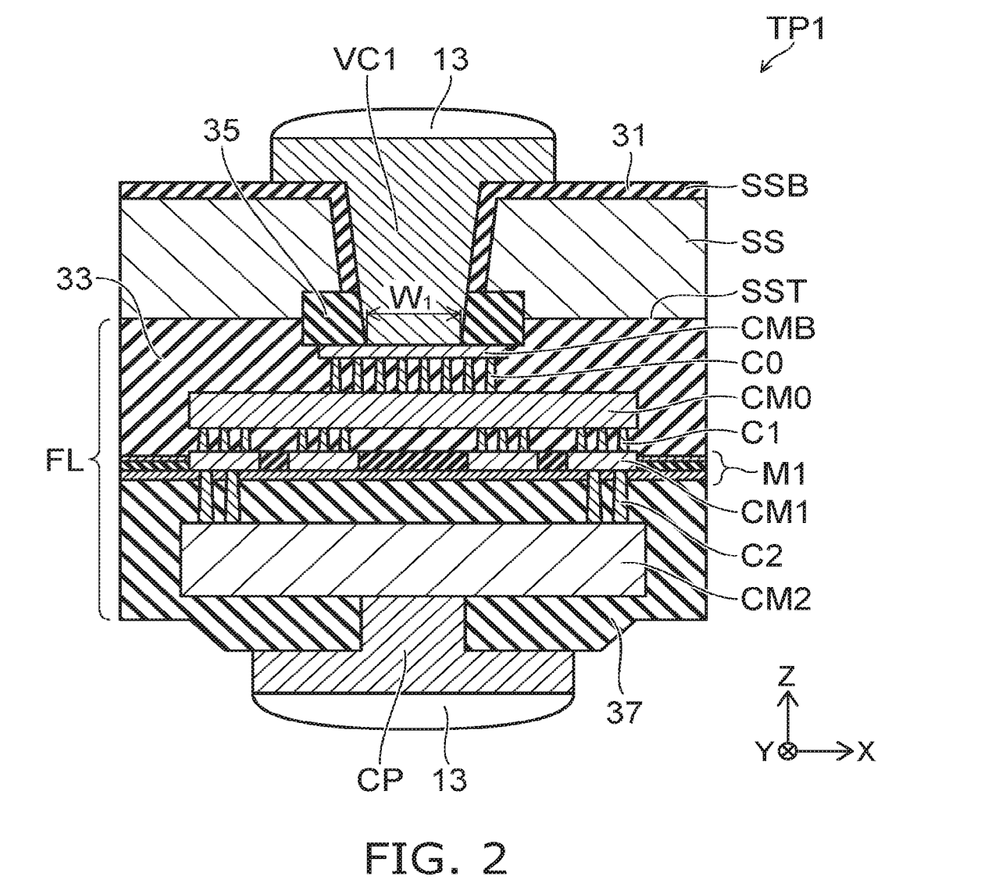
FIG. 2 is a partial cross-sectional view schematically showing a connection structure of the semiconductor device according to the embodiment.
Figure 3:
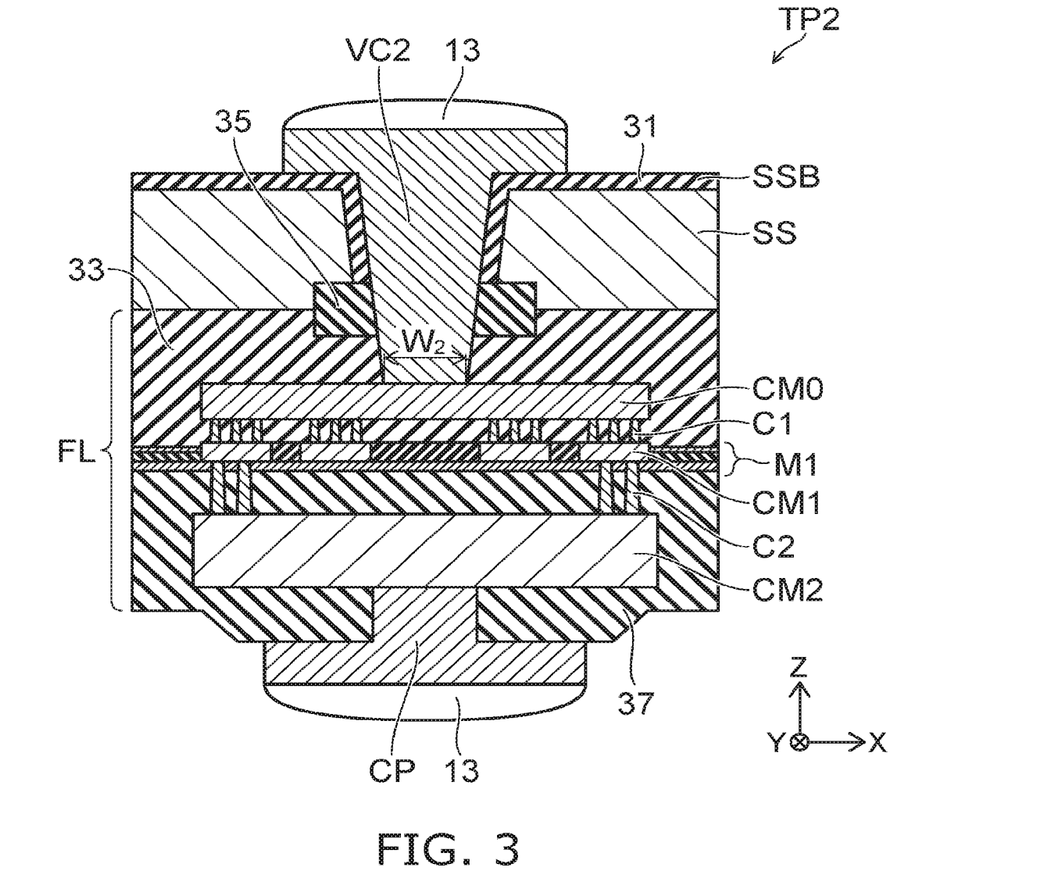
FIG. 3 is a partial cross-sectional view schematically showing another connection structure of the semiconductor device according to the embodiment.

FIGS. 2 and 3 are partial cross-sectional views schematically showing the connection structures of the semiconductor device 1 according to the embodiment. FIG. 2 is a schematic cross-sectional view showing a terminal part TP1 connecting the semiconductor chips SC1-SCn to each other. FIG. 3 is a schematic cross-sectional view showing another terminal part TP2.

As shown in FIGS. 2 and 3, the semiconductor chips SC1-SCn each include a semiconductor substrate SS and a functional layer FL. The semiconductor substrate SS has e.g. an element surface SST, and a back surface SSB opposite thereto. The functional layer FL and is provided on the element surface SST, and includes e.g. a memory element.

The terminal part TP1 shown in FIG. 2 includes a through electrode VC1 and a microbump CP. The through electrode VC1 extends through the semiconductor substrate SS from the back surface SSB to the element surface SST, and is electrically connected to the functional layer FL. The micro-bump CP is provided on the front surface of the functional layer FL.

The through electrode VC1 is electrically insulated from the semiconductor substrate SS by an insulating film 31. The through electrode VC1 is connected via a micro-bump 13 to the functional layer FL of the semiconductor chip adjacent to the semiconductor substrate SS on the back surface SSB side. The micro-bump CP is connected via another micro-bump 13 to the back surface of the semiconductor chip adjacent to the functional layer FL on the front surface side.

The functional layer FL includes a plurality of contact pads CMB, CM0, CM1, and CM2 between the through electrode VC1 and the micro-bump CP. The contact pads CMB, CM0, CM1, and CM2 are sequentially placed in the direction from the through electrode VC1 to the micro-bump CP.

An interlayer insulating film 33 is provided between the contact pads. The contact pad CMB is provided on the semiconductor substrate SS via an insulating film 35. The contact pad CMB is connected to the contact pad CM0 through a plurality of contact plugs C0. The contact pad CM0 is connected to the contact pad CM1 via a plurality of contact plugs C1. The contact pad CM1 is connected to the contact pad CM2 via a plurality of contact plugs C2. The contact pad CM1 is provided e.g. at the same level in the Z-direction as the interconnection layer M1 of the functional layer FL, and connected to the interconnection in the interconnection layer M1.

The through electrode VC1 extends through the insulating film 35 and is connected to the contact pad CMB. The micro-bump CP extends through an insulating film 37 covering the surface of the functional layer FL, and is connected to the contact pad CM2. The widths of the contact plugs C0, C1, and C2 connecting the contact pads is narrower in the X-direction and the Y-direction than the widths of the through electrode VC1 in the X-direction and the Y-direction, and narrower than the widths of the micro-bump CP in the X-direction and the Y-direction.

The terminal part TP2 shown in FIG. 3 includes a through electrode VC2 and a micro-bump CP. The through electrode VC2 extends through the semiconductor substrate SS from the back surface SSB to the element surface SST, and is electrically connected to the functional layer FL. The through electrode VC2 is electrically insulated from the semiconductor substrate SS by the insulating film 31.

The terminal part TP2 is not provided with the contact pad CMB and the contact plug C0. The through electrode VC2 is directly connected to the contact pad CM0. The X-direction width $W_2$ of the portion of the through electrode VC2 connected to the contact pad CM0 is wider than the X-direction width $W_1$ (see FIG. 2) of the portion of the through electrode VC1 connected to the contact pad CMB.

Figure 4:
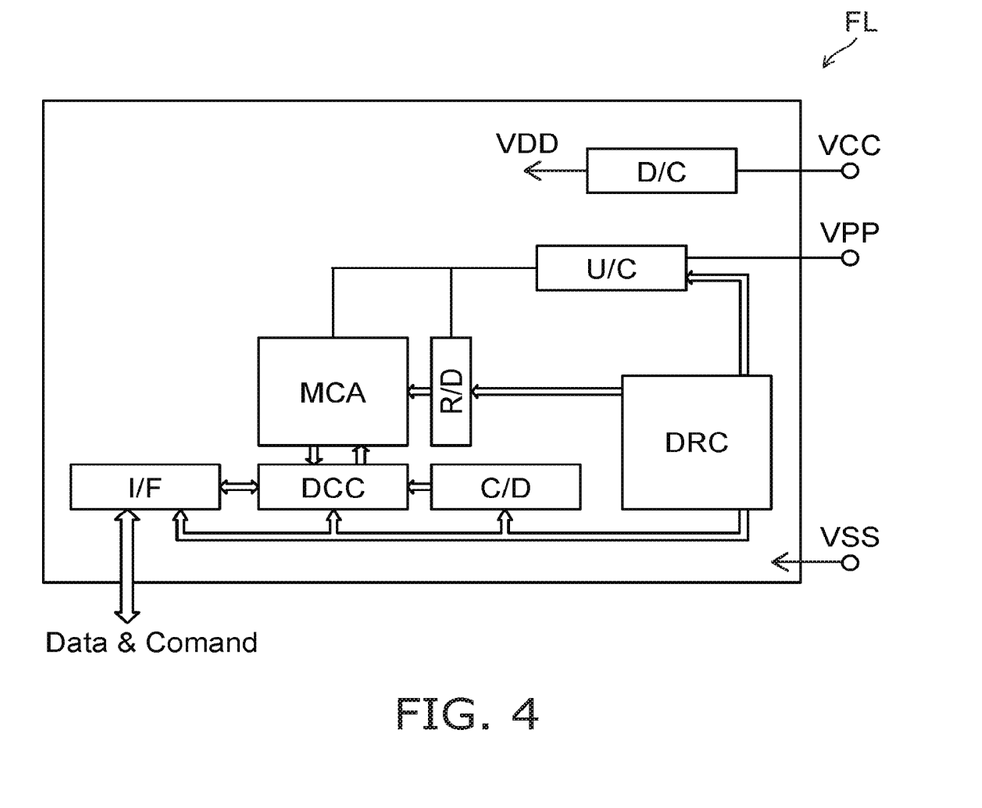
FIG. 4 is a block diagram showing a configuration of the functional layer of the semiconductor device according to the embodiment.

FIG. 4 is a block diagram showing the configuration of the functional layer FL of the semiconductor device 1 according to the embodiment. The functional layer FL is e.g. a memory element that includes a memory cell array MCA and a control circuit DRC.

The control circuit DRC drives the memory cell array MCA through e.g. a row decoder R/D, a column decoder C/D, a data control circuit DCC, an interface circuit I/F, and a step-up circuit U/C.

As shown in FIG. 4, external voltages VCC, VPP, and VSS are supplied to the functional layer FL. Data and commands are transmitted between the interface circuit I/F and the logic chip 20.

The external voltage VCC is supplied to e.g. a step-down circuit D/C. The step-down circuit D/C supplies an internal voltage VDD to each circuit block in the functional layer FL. The external voltage VPP is supplied to e.g. the step-up circuit U/C. The step-up circuit U/C supplies e.g. a program voltage to the row decoder and a data erasure voltage to the memory cell array MCA.

The interface circuit I/F transmits data and commands through e.g. the terminal part TP1. The external voltages VCC, VPP, and VSS are supplied through e.g. a plurality of terminal parts TP2.

The terminal part TP2 is not provided with e.g. the contact pad CMB and the contact plug C0. The through electrode VC2 is directly connected to the contact pad CM0. Thereby, the electrical resistance is reduced between the through electrode VC2 and the micro-bump CP.

For instance, as advancing the integration of the memory cell array MCA and each circuit in the functional layer FL, the widths of the contact plugs C0, C1, and C2 are also narrowed in the X-direction and the Y-direction, and the internal resistance thereof is increased. Thereby, the internal resistance increases between the through electrode VC and the micro-bump CP. Thus, the voltage drop due to the internal resistance in the terminal part TP enlarges the difference between voltages supplied to the semiconductor chips SC1-SCn, and causes malfunctions in functional layers FL.

In the embodiment, the external voltage is supplied through the terminal part TP2, reducing the internal resistance and suppressing the difference between the voltages supplied to the semiconductor chips SC1-SCn. On the other hand, the terminal part TP1 includes the through electrode VC1 having a narrower width in the X-direction and the Y-direction than the through electrode VC2. Thereby, it is possible to perform the high-speed transmission between the logic chip 20 and each interface circuit I/F of functional layers FL in the semiconductor chips SC1-SCn.

Figure 5:
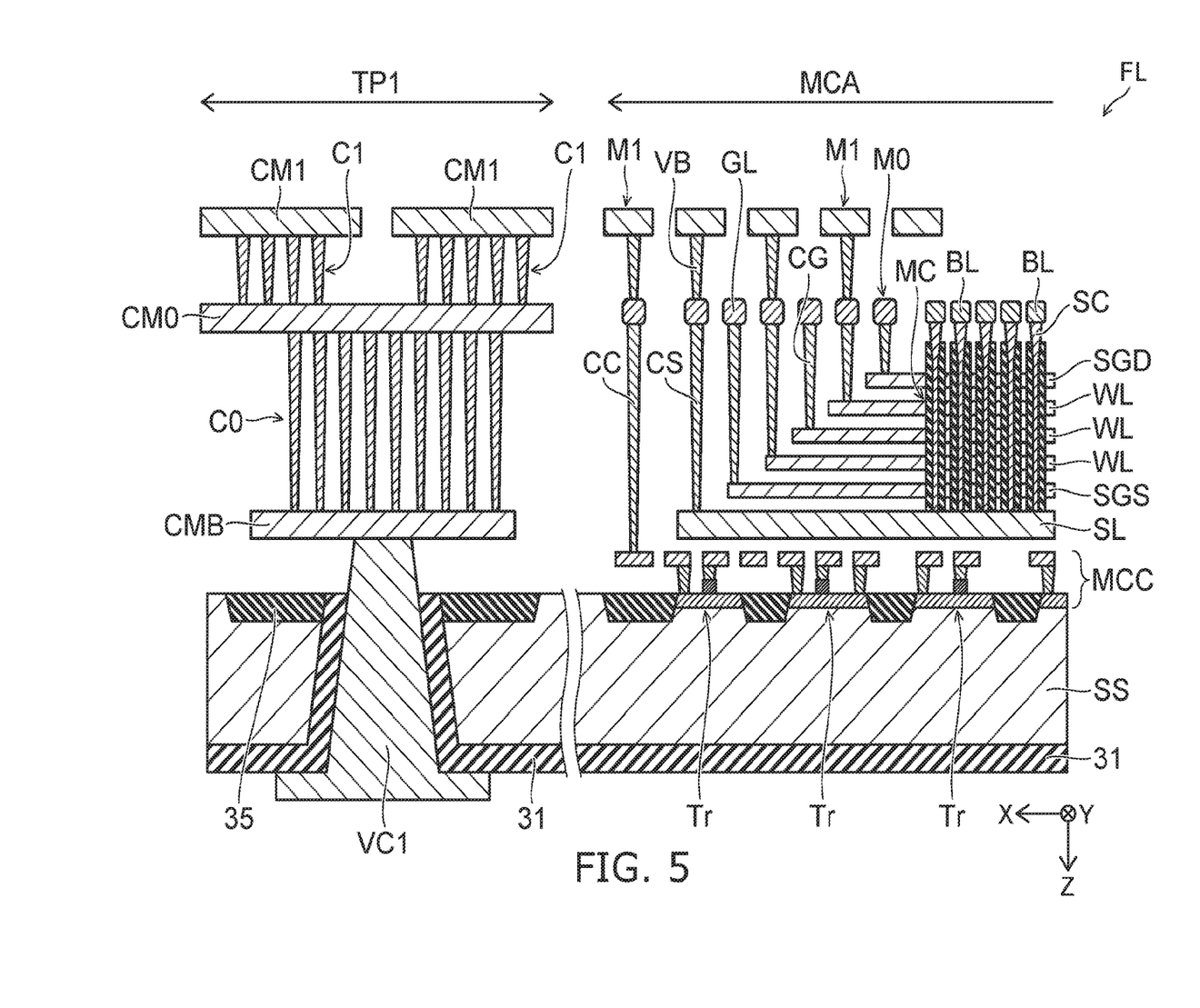
FIG. 5 is a schematic cross-sectional view illustrating the functional layer of the semiconductor device according to the embodiment.

FIG. 5 is a schematic sectional view illustrating the functional layer FL of the semiconductor device 1 according to the embodiment. The semiconductor device 1 includes a plurality of memory chips stacked on the base member 10. Each functional layer FL of the memory chips is e.g. a NAND-type memory element, and includes a memory cell array MCA that includes memory cells MC arranged in three dimensions, and terminal parts TP1 and TP2 (see FIG. 3).

As shown in FIG. 5, the memory cell array MCA includes a plurality of electrode layers (e.g. select gate SGS, word lines WL, select gate SGD) stacked above the semiconductor substrate SS, and a semiconductor channel SC. The semiconductor channel SC extends in the Z-direction through the plurality of electrode layers. The memory cells MC are provided at the crossing positions of the semiconductor channel SC and the word lines WL.

A source layer SL is provided between the semiconductor substrate SS and the select gate SGS positioned at the lowermost level of the plurality of electrode layers. The source layer SL is connected to the semiconductor channel SC. A circuit MCC is placed between the semiconductor substrate SS and the source layer SL, and includes a transistor Tr provided in the surface layer of the semiconductor substrate SS.

The circuit MCC includes e.g. a control circuit DRC, a row decoder R/D, a column decoder C/D, a data control circuit DCC, an interface circuit I/F, a step-up circuit U/C, and a step-down circuit D/C (see FIG. 4).

Interconnection layers M0 and M1 are provided above the plurality of electrode layers. The interconnection layer M0 is positioned between the interconnection layer M1 and the plurality of electrode layers. The interconnection layer M0 includes e.g. a bit line BL connected to the semiconductor channel SC and a gate interconnection GL connected to each electrode layer.

Contact plugs CG, CS, CC, and VB are placed in the memory cell array MCA. The contact plug CG connects each electrode layer to the gate interconnection GL. The contact plug CS connects the source layer SL to another interconnection in the interconnection layer M0. The contact plug CC connects the circuit in the lower layer to yet another interconnection in the interconnection layer M0. The contact plug VB connects an interconnection in the interconnection layer M0 to an interconnection in the interconnection layer M1.

The terminal part TP1 includes a contact pad CMB, a contact pad CM0, and a contact pad CM1 provided between the through electrode VC1 and the micro-bump CP (see FIG. 2).

As shown in FIG. 5, the contact pad CMB is positioned at a level same as the level of the source layer SL in the Z-direction. The contact pad CM0 is positioned at a level same as the level of the interconnection layer M0 in the Z-direction. The contact pad CM1 is positioned at a level same as the level of the interconnection layer M1 in the Z-direction. The contact pad CM1 is connected to the interconnection in the interconnection layer M1 at a portion not shown. The contact pad CM1 is electrically connected to e.g. the circuit MCC.

The contact pad CMB and the contact pad CM0 are electrically connected through a plurality of contact plugs C0. The contact plugs C0 are placed at the same level as the contact plugs CG, CS, and CC in the memory cell array MCA. That is, in the manufacturing process of the semiconductor chips SC1-SCn, the contact plugs C0 are simultaneously formed with the contact plugs CG, CS, and CC. Thus, the contact plugs C0 may have the same size as the size of the contact plugs CG, CS, and CC.

Furthermore, the contact pad CM0 and the contact pad CM1 are electrically connected through a plurality of contact plugs C1. The contact plugs C1 are placed at the same level as the contact plug VB in the memory cell array MCA. That is, in the manufacturing process of the semiconductor chips SC1-SCn, the contact plugs C1 are simultaneously formed with the contact plug VB. Thus, the contact plugs C1 have the same size as the size of the contact plug VB.

Thus, in the terminal part TP1 provided between the through electrode VC1 and the micro-bump CP, the contact pads CMB-CM1 and the contact plugs C0 and C1 are formed simultaneously with the memory cell array MCA. Accordingly, advancing integration of the memory cell array MCA results in the size reduction of the contact plugs C0 and C1, and increases the internal resistance thereof. Thus, in the terminal part TP2 through which an external voltage is supplied to the functional layer FL, the number of the contact pads CMB-CM1 is decreased so that the through electrode VC2 is connected to the contact pad positioned at an upper level. Thereby, it is possible to suppress variations in the voltages VCC, VPP, and VSS supplied to the functional layer FL. The functional layer FL shown in FIG. 5 also includes the terminal part TP2 placed in a portion not shown.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a base member; and
   a plurality of semiconductor chips stacked on the base member, the plurality of semiconductor chips being electrically connected to each other, and including a first semiconductor chip and a second semiconductor chip adjacent to the first semiconductor chip,
   the first semiconductor chip including a semiconductor substrate, a functional layer and a plurality of through electrodes, the semiconductor substrate having an element surface and a back surface opposite to the element surface, the functional layer being provided on the element surface, the plurality of through electrodes extending from the back surface to the element surface in the semiconductor substrate, and being electrically connected to the functional layer,
   the second semiconductor chip being electrically connected to the first semiconductor chip through connection members connected to the plurality of through electrodes, respectively,
   the functional layer including a first contact pad and a second contact pad, the second contact pad being positioned at a level between the semiconductor substrate and the first contact pad in a stacking direction of the plurality of semiconductor chips,
   the plurality of through electrodes including a first through electrode connected to the first contact pad and a second through electrode connected to the second contact pad,
   the plurality of semiconductor chips each including an insulating film electrically insulating the plurality of through electrodes from the semiconductor substrate.

2. The device according to claim 1, wherein the first semiconductor chip is configured such that an external voltage is supplied to the functional layer through the first through electrode and the first contact pad.

3. The device according to claim 1, further comprising:

another semiconductor chip provided between the base member and a lowermost semiconductor chip of the plurality of semiconductor chips placed at a position closest to the base member, the another semiconductor chip transmitting a signal to the plurality of semiconductor chips, wherein the first semiconductor chip is configured such that the signal is transmitted to the functional layer through the second through electrode and the second contact pad.

4. The device according to claim 1, wherein a width of the second through electrode is narrower in a first direction crossing the stacking direction than a width in the first direction of the first through electrode.

5. The device according to claim 1, wherein the functional layer includes an interconnection layer positioned at a level close to a level of the first contact pad in the stacking direction, and a third contact pad positioned at a level substantially same as the level in the stacking direction of the interconnection layer and connected to an interconnection in the interconnection layer, the second contact pad is positioned between the second through electrode and the third contact pad, the second contact pad being electrically connected to the third contact pad through a plurality of first contact plugs, and a width of the plurality of first contact plugs is narrower in a first direction crossing the stacking direction than widths in the first direction of the first through electrode and the second through electrode.

6. The device according to claim 5, wherein the functional layer further includes a fourth contact pad positioned between the second contact pad and the third contact pad, the second contact pad being connected to the fourth contact pad through the plurality of first contact plugs, and the fourth contact pad is connected to the third contact pad through a plurality of second contact plugs.

7. The device according to claim 1, wherein the plurality of semiconductor chips further include a third semiconductor chip adjacent to the first semiconductor chip, the first semiconductor chip being positioned between the second semiconductor chip and the third semiconductor chip and being electrically connected to the third semiconductor chip through another connection member different from the connection member, and the functional layer includes a fifth contact pad connected to the another connection member.

8. The device according to claim 7, wherein the first contact pad and the second contact pad are positioned at levels between the fifth contact pad and the semiconductor substrate in the stacking direction.

9. The device according to claim 8, wherein the functional layer includes an interconnection layer positioned at a level close to the level of the first contact pad in the stacking direction, and a third contact pad located at a level substantially same as the level in the stacking direction of the interconnection layer, the third contact pad being connected to an interconnection in the interconnection layer, and the fifth contact pad is connected to the third contact pad through a plurality of third contact plugs.

10. A semiconductor device comprising:

a base member; and a plurality of memory chips stacked on the base member and electrically connected to each other through connection members, the plurality of memory chips including a first memory chip and a second memory chip adjacent to the first memory chip, the first memory chip including a semiconductor substrate having an element surface and a back surface opposite to the element surface, a memory cell array provided on the element surface and including a plurality of memory cells, terminal parts electrically connected to the memory cell array, and a plurality of through electrodes extending from the back surface to the element surface in the semiconductor substrate and connected to the terminal parts, the second memory chip being electrically connected to the first memory chip through the connection members connected to the plurality of through electrodes, the terminal parts including a first terminal part and a second terminal part, the first terminal part including a first contact pad, the second terminal part including a second contact pad positioned at a level between the semiconductor substrate and the first contact pad in a stacking direction of the plurality of memory chips, and the plurality of through electrodes including a first through electrode connected to the first contact pad in the first terminal part, and a second through electrode connected to the second contact pad in the second terminal part.

11. The device according to claim 10, wherein the first memory chip further includes a circuit provided between the semiconductor substrate and the memory cell array, and the first memory chip is configured such that an external voltage is supplied to the circuit through the first through electrode and the first contact pad.

12. The device according to claim 11, wherein the first memory chip is configured such that a signal is transmitted to the circuit through the second through electrode and the second contact pad.

13. The device according to claim 12, wherein the first memory chip further includes a third contact pad provided in the second terminal part and an interconnection layer including an interconnection connected to the memory cell array and the third contact pad, and the second contact pad is positioned between the second through electrode and the third contact pad, the second contact pad being electrically connected to the third contact pad through a plurality of first contact plugs.

14. The device according to claim 13, wherein the memory cell array includes a plurality of electrode layers stacked in the stacking direction, a semiconductor layer extending through the plurality of electrode layers in the stacking direction, and a plurality of second contact plugs connecting the plurality of electrode layers and other interconnections in the interconnection layer, and the plurality of second contact plugs are positioned at a level substantially same in the stacking direction as a level in the stacking direction of the plurality of first contact plugs.

15. The device according to claim 13, wherein the interconnection layer includes an interconnection connecting the third contact pad and the circuit.

16. The device according to claim 13, wherein the third contact pad is positioned at a level substantially same in the stacking direction as a level of the interconnection layer in the stacking direction.

17. The device according to claim 13, wherein
the second terminal part further includes a fourth contact pad positioned between the second contact pad and the third contact pad,
the second contact pad is connected to the fourth contact pad through the plurality of first contact plugs, and
the fourth contact pad is connected to the third contact pad through a plurality of third contact plugs.

18. The device according to claim 13, wherein widths of the plurality of first contact plugs in a first direction crossing the stacking direction is narrower than a width in the first direction of the second through electrode.

19. The device according to claim 10, wherein a width of the first through electrode in a first direction crossing the stacking direction is wider than a width of the second through electrode in the first direction.

20. A semiconductor device comprising:
a base member;
a plurality of semiconductor chips stacked on the base member, the plurality of semiconductor chips being electrically connected to each other, and including a first semiconductor chip and a second semiconductor chip adjacent to the first semiconductor chip; and
another semiconductor chip provided between the base member and a lowermost semiconductor chip of the plurality of semiconductor chips placed at a position closest to the base member, the another semiconductor chip transmitting a signal to the plurality of semiconductor chips,
the first semiconductor chip including a semiconductor substrate, a functional layer and a plurality of through electrodes, the semiconductor substrate having an element surface and a back surface opposite to the element surface, the functional layer being provided on the element surface, the plurality of through electrodes extending from the back surface to the element surface in the semiconductor substrate, and being electrically connected to the functional layer,
the second semiconductor chip being electrically connected to the first semiconductor chip through connection members connected to the plurality of through electrodes, respectively,
the functional layer including a first contact pad and a second contact pad, the second contact pad being positioned at a level between the semiconductor substrate and the first contact pad in a stacking direction of the plurality of semiconductor chips,
the plurality of through electrodes including a first through electrode connected to the first contact pad and a second through electrode connected to the second contact pad,
the first semiconductor chip being configured such that the signal is transmitted to the functional layer through the second through electrode and the second contact pad.

* * * * *